United States Patent
Liu et al.

(10) Patent No.: US 10,804,750 B2
(45) Date of Patent: Oct. 13, 2020

(54) Q-FACTOR DETECTION METHOD

(71) Applicant: Integrated Device Technology, Inc., San Jose, CA (US)

(72) Inventors: Rui Liu, Fremont, CA (US); Zhitong Guo, San Jose, CA (US); Haiwen Jiang, San Jose, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 65 days.

(21) Appl. No.: 15/998,784

(22) Filed: Aug. 16, 2018

(65) Prior Publication Data

US 2019/0140489 A1 May 9, 2019

Related U.S. Application Data

(60) Provisional application No. 62/546,988, filed on Aug. 17, 2017.

(51) Int. Cl.
| | | |
|---|---|---|
| *H02J 50/60* | (2016.01) | |
| *H02J 50/12* | (2016.01) | |
| *G01V 3/38* | (2006.01) | |
| *G01R 27/26* | (2006.01) | |
| *H02J 7/02* | (2016.01) | |
| *G01V 3/10* | (2006.01) | |

(52) U.S. Cl.
CPC .......... *H02J 50/60* (2016.02); *G01R 27/2688* (2013.01); *G01V 3/38* (2013.01); *H02J 50/12* (2016.02); *G01V 3/101* (2013.01); *H02J 7/025* (2013.01)

(58) Field of Classification Search
CPC .. H02J 50/12; H02J 50/10; H02J 50/60; H02J 50/80; H02J 50/90; H02J 7/025; H02J 5/005; H01F 38/14
USPC ............ 307/149, 66, 64, 109, 9.1, 10.1, 104
See application file for complete search history.

(56) References Cited

U.S. PATENT DOCUMENTS

| | | | |
|---|---|---|---|
| 2003/0016008 A1* | 1/2003 | Christensen | G01V 3/104 324/207.26 |
| 2010/0328045 A1* | 12/2010 | Goto | G06K 7/10198 340/10.4 |
| 2013/0099587 A1* | 4/2013 | Lou | H02S 40/30 307/104 |
| 2013/0162054 A1* | 6/2013 | Komiyama | G01R 21/006 307/149 |
| 2014/0125287 A1 | 5/2014 | Nakano et al. | |

(Continued)

OTHER PUBLICATIONS

International Search Report issued by the International Searching Authority dated Nov. 29, 2018 for PCT Application No. PCT/US2018/00313. pp. 1-2.

(Continued)

*Primary Examiner* — Rexford N Barnie
*Assistant Examiner* — Jagdeep S Dhillon
(74) *Attorney, Agent, or Firm* — Haynes and Boone, LLP

(57) ABSTRACT

A method of measuring a Q-factor in a wireless power transmitter includes charging a capacitor in a LC tank circuit that includes a transmission coil to a voltage; starting a Q-factor determining by coupling the LC tank circuit to ground to form a free-oscillating circuit; monitoring the voltage across the capacitor as a function of time as the LC tank circuit oscillates; and determining the resonant frequency and the Q-factor from monitoring the voltage.

17 Claims, 5 Drawing Sheets

(56) References Cited

U.S. PATENT DOCUMENTS

| | | | |
|---|---|---|---|
| 2015/0108847 A1* | 4/2015 | Taylor | H04B 5/0037 |
| | | | 307/104 |
| 2015/0323694 A1 | 11/2015 | Roy et al. | |
| 2016/0248279 A1 | 8/2016 | Nakano et al. | |
| 2017/0117755 A1 | 4/2017 | Muratov et al. | |
| 2017/0117756 A1 | 4/2017 | Muratov | |
| 2019/0020210 A1* | 1/2019 | Partovi | H02J 50/80 |
| 2019/0214852 A1* | 7/2019 | Park | H01F 38/14 |
| 2019/0319494 A1* | 10/2019 | Park | G01R 27/26 |

OTHER PUBLICATIONS

Written Opinion issued by the International Searching Authority dated Nov. 29, 2018 for PCT Application No. PCT/US2018/00313. pp. 1-9.

* cited by examiner

Q-FACTOR DETECTION METHOD

RELATED DOCUMENTS

This application claims priority to U.S. Provisional Patent Application 62/546,988, filed on Aug. 17, 2017, which is herein incorporated by reference in its entirety.

TECHNICAL FIELD

Embodiments of the present invention are related to wireless power systems and, specifically, to a method of Quality Factor (Q-Factor) Determination and FOD detection in a wireless power system.

DISCUSSION OF RELATED ART

Typically, a wireless power system includes a transmitter coil that is driven to produce a time-varying magnetic field and a receiver coil that is positioned relative to the transmitter coil to receive the power transmitted in the time-varying magnetic field. One measure of the efficiency of the system is to measure the Quality Factor (Q-Factor) of the resonant circuit that includes the transmitter coil. In general, the Q-Factor can be defined in a resonant circuit as a dimensionless figure-of-merit related to the ratio of the energy stored in the circuit over the amount of energy dissipated from the circuit per cycle. The resonant circuit in the transmitter typically includes the transmit coil coupled in series with a capacitance, the series circuit coupled across the driving voltage.

There are multiple reasons to determine the Q-Factor of a resonant circuit in wireless power system. The resonant circuit is affected by the receiver system and foreign objects in the field of the generated electromagnetic field. Consequently, monitoring the Q-Factor of the transmitter resonant circuit can be used as an indication of foreign objects. Further, monitoring the Q-Factor can help with operation because, as it is a function of resonant frequency, the Q-Factor can help determine the resonant frequency. Further, the Q-Factor can be used to facilitate communications methods.

Consequently, there is a need for better determination of the Q-factor in a wireless system.

SUMMARY

In accordance with some embodiments of the present invention, a wireless power transmitter that measures the Q-factor is provided. In accordance with some embodiments, the wireless power transmitter includes a transmit coil; a capacitor coupled in series with the transmit coil to form a resonant circuit; a bridge circuit coupled to the resonant circuit; a control circuit coupled to control the bridge circuit to provide voltages across the resonant circuit; a charging circuit coupled to charge the capacitor with a charging voltage and coupled to be controlled by the control circuit; and a detection circuit coupled to receive a voltage across the capacitor and provide data related to the voltage to the control circuit while the resonant circuit.

A method of measuring a Q-factor in a wireless power transmitter includes charging a capacitor in a LC tank circuit that includes a transmission coil to a voltage; starting a Q-factor determining by coupling the LC tank circuit to ground to form a free-oscillating circuit; monitoring the voltage across the capacitor as a function of time as the LC tank circuit oscillates; and determining the resonant frequency and the Q-factor from monitoring the voltage.

These and other embodiments are further discussed below with respect to the following figures.

DETAILED DESCRIPTION

In the following description, specific details are set forth describing some embodiments of the present invention. It will be apparent, however, to one skilled in the art that some embodiments may be practiced without some or all of these specific details. The specific embodiments disclosed herein are meant to be illustrative but not limiting. One skilled in the art may realize other elements that, although not specifically described here, are within the scope and the spirit of this disclosure.

This description and the accompanying drawings that illustrate inventive aspects and embodiments should not be taken as limiting—the claims define the protected invention. Various changes may be made without departing from the spirit and scope of this description and the claims. In some instances, well-known structures and techniques have not been shown or described in detail in order not to obscure the invention.

Elements and their associated aspects that are described in detail with reference to one embodiment may, whenever practical, be included in other embodiments in which they are not specifically shown or described. For example, if an element is described in detail with reference to one embodiment and is not described with reference to a second embodiment, the element may nevertheless be claimed as included in the second embodiment.

Figure 1A:
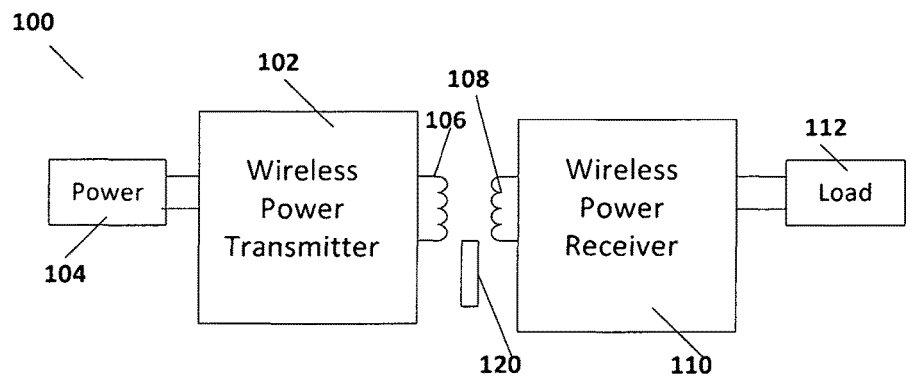
FIG. 1A illustrates a wireless power transmission system.

FIG. 1A illustrates a system 100 for wireless transfer of power. As illustrated in FIG. 1A, a wireless power transmitter 102 drives a coil 106 to produce a magnetic field. A power supply 104 provides power to wireless power transmitter 102. Power supply 104 can be, for example, a battery based supply or may be powered by alternating current for example 120V at 60 Hz. Wireless power transmitter 102 drives coil 106 at, typically, a range of frequencies, typically according to one of the wireless power standards. However, this could be applicable to any frequency where it is practical to transfer power and/or information by means of magnetic coils irrespective of any standard that may exist.

There are multiple standards for wireless transmission of power, including the Alliance for Wireless Power (A4WP) standard and the Wireless Power Consortium standard, the Qi Standard. Under the A4WP standard, for example, up to 50 watts of power can be inductively transmitted to multiple charging devices in the vicinity of coil 106 at a power transmission frequency of around 6.78 MHz. Under the Wireless Power Consortium (WPC), the Qi specification, a resonant inductive coupling system is utilized to charge a single device at the resonance frequency of the device. In the Qi standard, coil 108 is placed in close proximity with coil 106 while in the A4WP standard, coil 108 is placed near coil 106 along with other coils that belong to other charging devices. FIG. 1A depicts a generalized wireless power system 100 that operates under any of these standards. In Europe, the switching frequency has been limited to 148 kHz.

As is further illustrated in FIG. 1A, the magnetic field produced by coil 106 induces a current in coil 108, which results in power being received in a receiver 110. Receiver 110 receives the power from coil 108 and provides power to a load 112, which may be a battery charger and/or other components of a mobile device. Receiver 110 typically includes rectification to convert the received AC power to DC power for load 112.

Figure 1B:
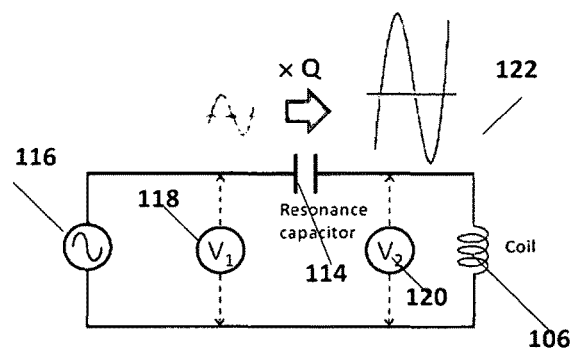
FIGS. 1B and 1C illustrate determination of a Q-factor.
Figure 1C:
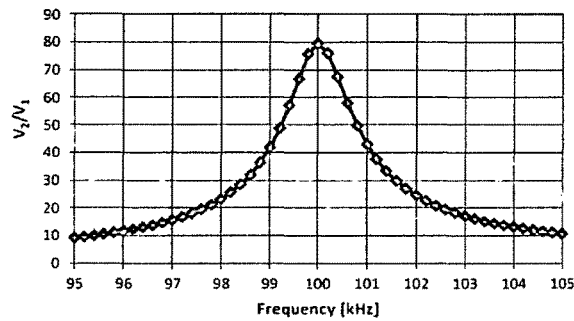

FIG. 1B depicts a resonant circuit 122 of wireless power transmitter 102. As is illustrated in FIG. 1B, transmit coil 106 is coupled in series with a resonant capacitor 114. A driver 116 is placed across the series coupled capacitor 114 and transmit coil 106 to drive resonant circuit 122. In some cases, driver 116 can operate at a range of frequencies and a range of voltage levels in order to provide current through transmit coil 106, generating wireless power at a range of power levels. The resonant frequency of resonant circuit 122 depends on the inductance of transmit coil 106 and the capacitance of resonant capacitor 114.

At a particular operating frequency from driver 116, the Q-factor can be determined as the ratio of the voltage across transmit coil 106 and the voltage across driver 116. As shown in FIG. 1B, a voltage meter circuit 118 can be placed across driver 116 to measure voltage $V_1$ and a voltage meter circuit 120 across transmit coil 106 to measure $V_2$. A typical graph of the ratio V2/V1 as a function of frequency is illustrated. During normal operation of wireless power transmitter 102, both the frequency of highest Q (the resonant frequency) and the width and height of the curve can change. In particular, the height of the peak Q-factor of resonant circuit 122 can be substantially reduced in the presence of a foreign object 120.

If there is a foreign object 120 in the field produced by transmit coil 106, as is illustrated in FIG. 1A, then foreign object 120 absorbs, in heating, some of the wireless power transmitted through transmit coil 106. This absorption can affect the resonance frequency of resonant circuit 122. Foreign object 120 also reduces the peak Q-factor (the Q-factor at the resonant frequency) of resonant circuit 122. In some standards, when wireless power transmitter 102 may measure the quality factor. The quality factor can be used to determine whether or not a foreign object 120 is present.

Figure 2A:
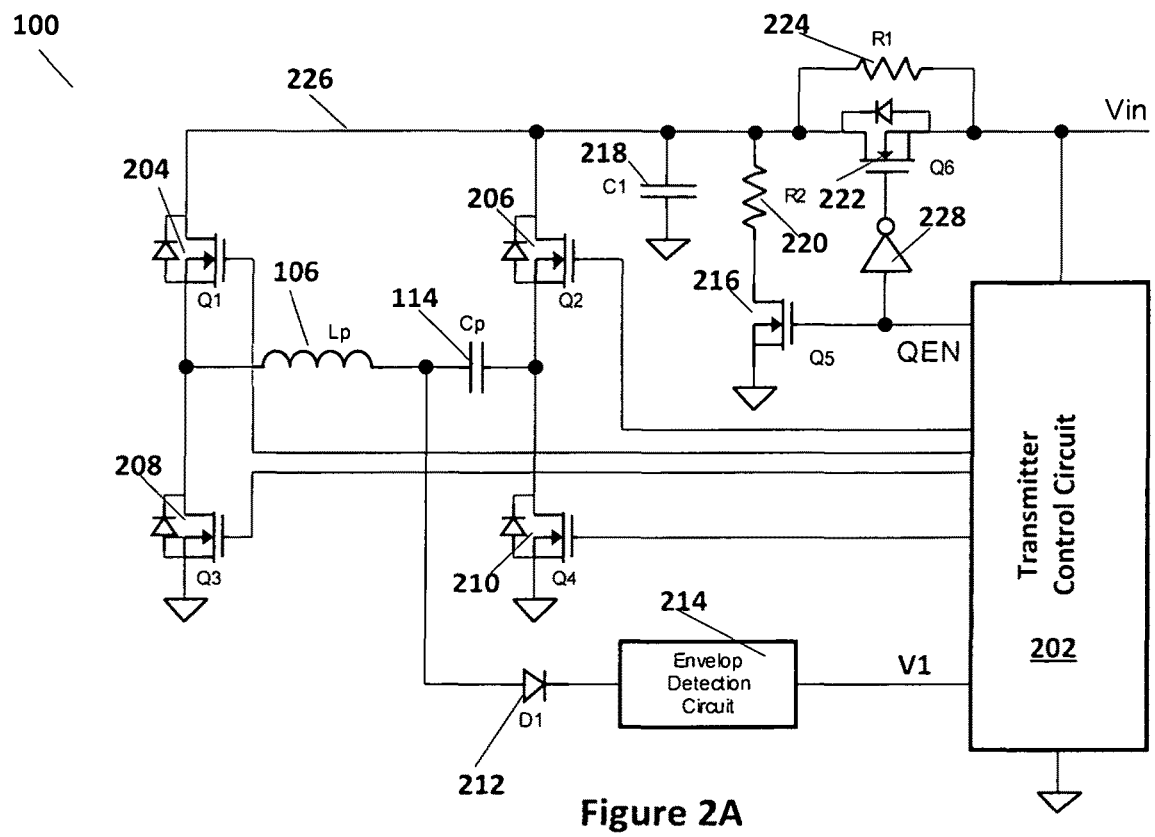
FIGS. 2A and 2B illustrate a conventional way of determining the Q-factor.

FIG. 2A illustrates a conventional transmitter circuit 100 similar to that illustrated in FIG. 1A. As is illustrated, a transmitter control circuit 202 drives transmission coil Lp 106 by exciting the tank circuit formed by Lp 106 and Cp 114 with a full-wave rectifier bridge formed by transistors Q1 204, Q3 208, Q2 206, and Q4 210. As is illustrated in FIG. 2A, transistors Q1 204 and Q3 208 are coupled in series between a voltage rail 226 and ground. Similarly, transistors Q2 206 and Q4 210 are coupled in series between voltage rail 226 and ground. In addition, a capacitor 218 can be coupled between voltage rail 226 and ground.

Series-coupled transmit coil Lp 106 and capacitor Cp 114 are coupled between a node between transistors Q1 204 and Q3 208 and a node between transistors Q2 206 and Q4 210. The gates of transistors Q1 204, Q2 206, Q3 208, and Q4 210 are driven by transmitter control circuit 202. In operation, transmitter control circuit 202 alternates between a first mode with transistor Q1 204 and Q4 210 on while transistors Q3 208 and Q2 206 are off and a second mode with transistors Q1 204 and Q4 210 off while transistors Q3 208 and Q2 206 are on. Consequently, transmitter control circuit 202 can alternate between the first mode, which drives current through transmit coil 106 in a first direction, and the second mode, which drives current through transmit coil 106 in a second direction opposite the first direction, at a driving frequency f.

As illustrated in FIG. 2A, voltage rail is coupled through transistor Q6 222 to input voltage Vin. Transistor Q6 222 is turned on by an enable signal QEN from transmitter control circuit 202. In the example illustrated in FIG. 2A, the enable signal from transmitter control circuit 202 is coupled to the gate of transistor 222 through an inverter 228. While transmitting wireless power, transmitter control circuit 202 enables transistor 222 to provide the input voltage Vin to voltage rail 226. As illustrated in FIG. 1A, the wireless power that is then provided through transmit coil 106 is coupled to receiver 110.

However, in some cases, there may be a need to measure the Q-factor in the resonant circuit of transmitter 100 without providing enough power to activate receiver 110. As is illustrated in FIG. 2A, when transistor Q6 222 is not enabled (i.e. not coupling the input voltage Vin to voltage rail 226), transistor Q5 216 is enabled which forms a resistive divider from resistor R1 224 and resistor R2 220. When Q5 216 is enabled, power is supplied to voltage rail 226 by resistors R1 224 and R2 220.

In order to detect the Q-factor without activating receiver 110, resistors R1 224 and R2 226 and transistor Q5 216 turned on (with transistor Q6 222 off) form a low voltage generation circuit to provide voltage to voltage rail 226 to use while the Q-factor detection process is performed. Further in some examples, transistors Q1 204 and Q3 208 can be operated as a half-bridge driver with transistor Q2 206 off and transistor Q4 210 on. The half-bridge driver formed by transistors Q1 204 and Q3 208 can then drive the LC resonant circuit formed by transmit coil Lp 106 and capacitor Cp 114.

As is further illustrated in FIG. 2A, the voltage at a node between transmit coil 106 and capacitor 114 is input to a diode D1 212. The output signal from diode D1 212 is then input to Envelop Detection Circuit 214. Diode D1 212 can operate as a rectifier while envelop detection circuit 214 can produce the RMS voltage V1 across capacitor Cp 114. Tracking the amplitude of the resonant capacitor voltage, V1, can be used to determine the Q-factor of the LC resonant circuit.

During the Q-factor detection process, transmitter control circuit 202 sweeps the switching frequency f through a frequency range. The range can be, for example, from a low frequency (for example 80 kHz) to a high frequency (for example 120 kHz) in a frequency step (for example 100 Hz steps). The Transmitter may sweep the frequencies from low-to-high or from high-to-low.

Figure 2B:
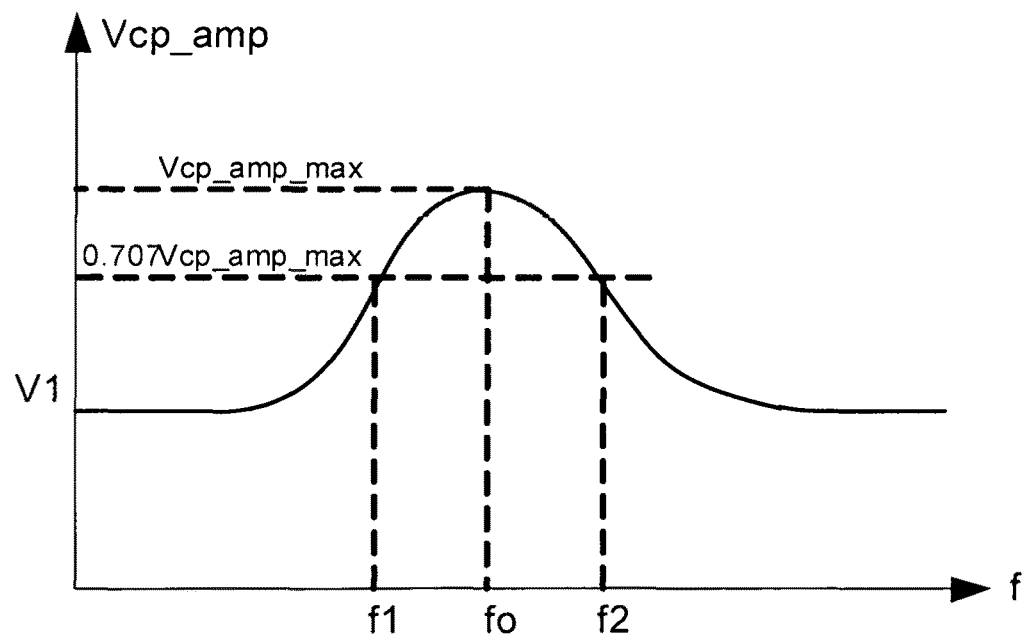

FIG. 2B illustrates the voltage as a function of frequency during the sweep. As is illustrated in FIG. 2B, by sweeping through the frequency range, transmitter control circuit 202 can determine the maximum voltage amplitude (Vcp) of V1, the resonant frequency (f0), which is the frequency of the maximum voltage amplitude (Vcp), and the high and low 3 dB power points at frequencies f1 and f2. Consequently, from this sweep, transmitter control circuit 202 can determine the resonant frequency, the Q-factor at any frequency (including the maximum Q-factor that occurs at the maximum frequency), and the power factor values for 3 dB points f1 and f2.

However, such an approach to determination of the operating parameters of the resonant circuit formed by transmit coil 106 and capacitor 114 has multiple challenges. First, in order to measure the Q-factor accurately, the bridge input voltage at voltage rail 226, i.e. across capacitor C1 218, must be very small (0.5V or less) in order to not activate receiver 110. This is difficult to create and maintain in practice, in particular for high input voltage Vin (e.g. 9V and above). Second, the amplitude of the voltage across capacitor Cp 114 depends on the equivalent series resistance in the transmit coil Lp 106 and capacitor Cp 114 resonant circuit. This factor is also difficult to control, in particular when the Q-factor is very high. Thirdly, the sweep step frequency introduces quantitative measurement error because the sweep frequency may not hit the resonant frequency directly. This creates difficulty in calculating the actual resonant frequency, and therefore predicting the maximum voltage. Finally, the Q-factor detection process may take a relatively long time to finish depending on how many steps are included in the sweep. A large number of frequency steps may give a better determination of the resonant frequency, but takes a long time. A smaller number of frequency steps results in a less accurate determination of the resonant frequency, although it may not take as long.

In accordance with embodiments of the present invention, a method that includes charging a capacitor in a LC tank circuit (resonant circuit) that includes series coupled transmit coil and capacitor to a charging voltage and starting the resonant circuit in a free-oscillation is provided. The voltage across the capacitor can be measured in the free-oscillation and the resonant frequency and the Q-factor can be determined from that data. There is no need for a frequency sweep or for a large database to be obtained. The data can be obtained faster and the analysis can be accomplished more accurately and quicker.

Figure 4A:
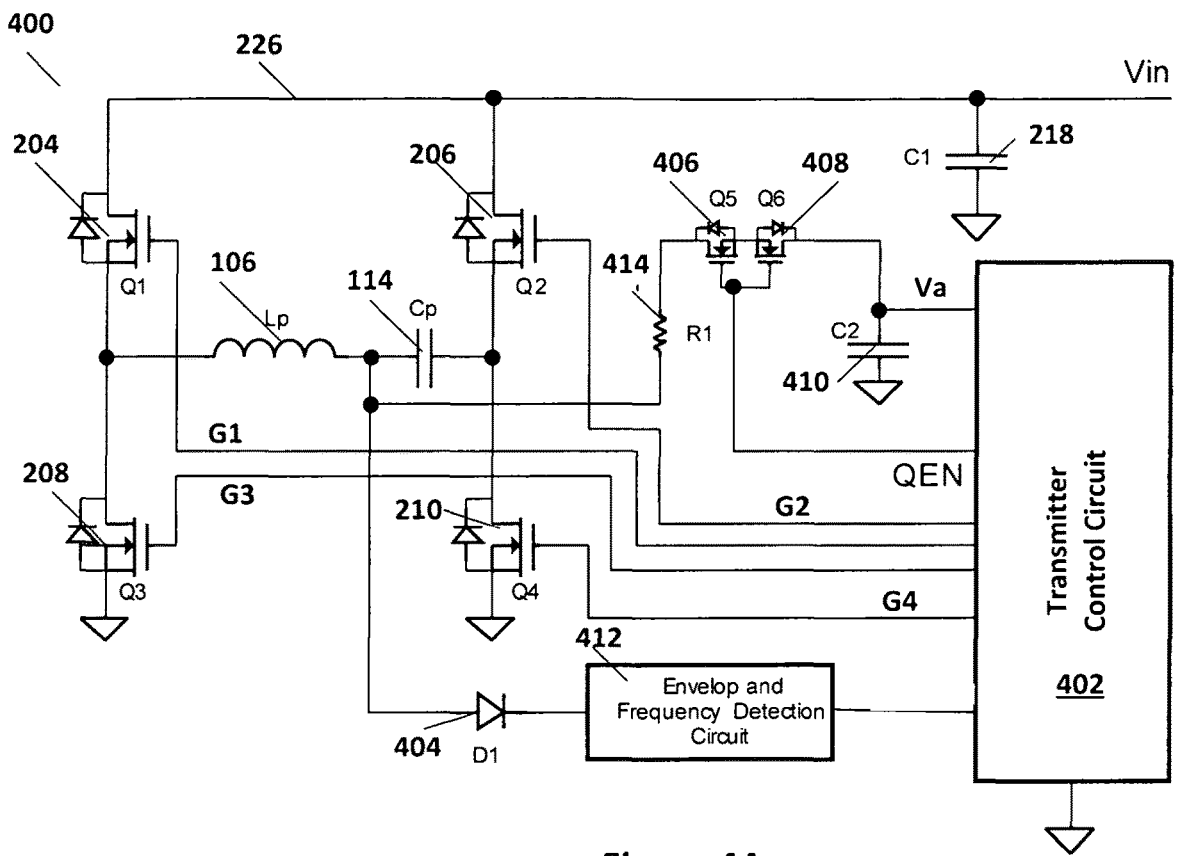
FIG. 4A illustrates a wireless power transmitter according to some embodiments of the present invention.
Figure 4C:
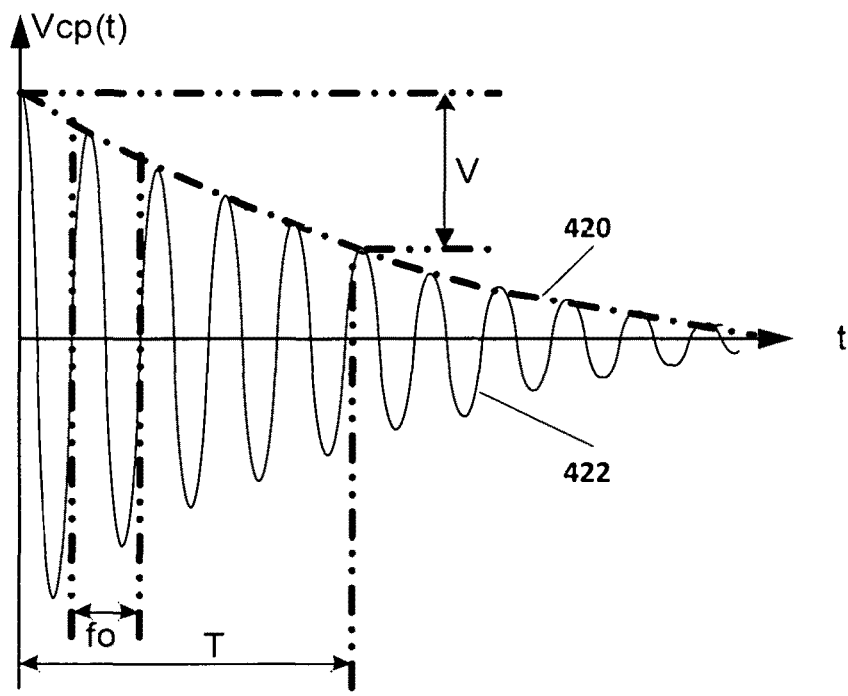
FIGS. 4B and 4C illustrate a method of determining the Q-factor and other parameters according to some embodiments of the present invention.
Figure 4B:
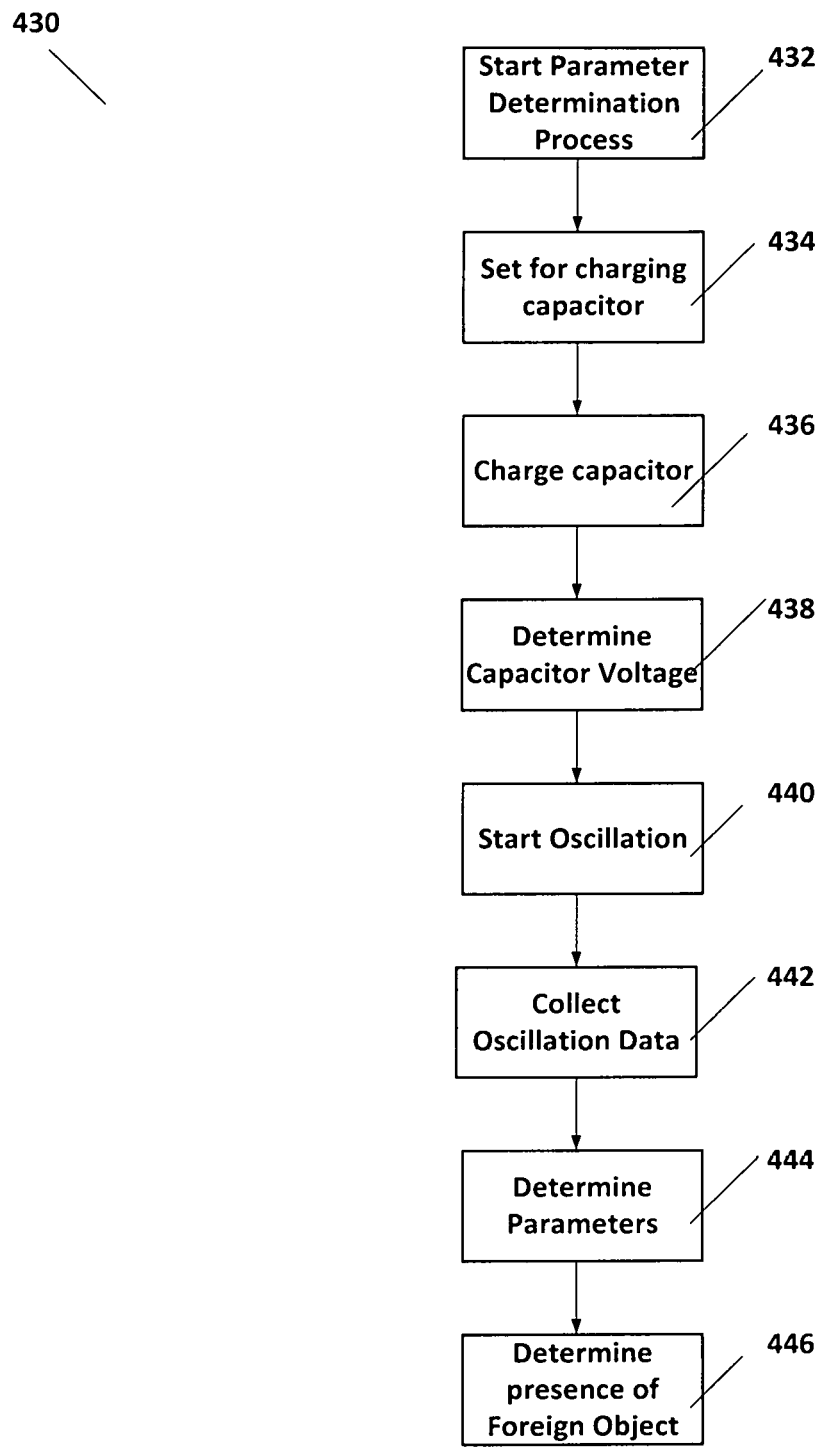

FIGS. 4A, 4B, and 4C illustrate a wireless power transmitter 400 according to some embodiments of the present invention. As is illustrated in FIG. 4A, wireless power transmitter 400 includes a transmit and control circuit 402 coupled to drive transistors Q1 204, Q2 206, Q3 208, and Q4 210 in order to provide current through the resonant circuit formed by series-coupled transmit capacitor 106 and capacitor 114. Transmitter control circuit 402 can be utilized to provide a faster and more accurate determination of the Q-factor of the resonant circuit that includes transmit coil 106 and capacitor 114. First of all, transmitter control circuit 402 in many configurations can provide a voltage that can be used to drive the resonant circuit formed by transmission coil 106 and capacitor 114 without producing wireless power sufficient to activate receiver 110. Further, a ring-down method can be used to measure the Q-factor and the resonant frequency of the circuit in a process that may be much faster and more accurate than the conventional method described above. FIGS. 4A, 4B, and 4C illustrate a transmitter 400 configured to measure the Q-factor and other parameters according to some embodiments of the present invention.

Figure 3:
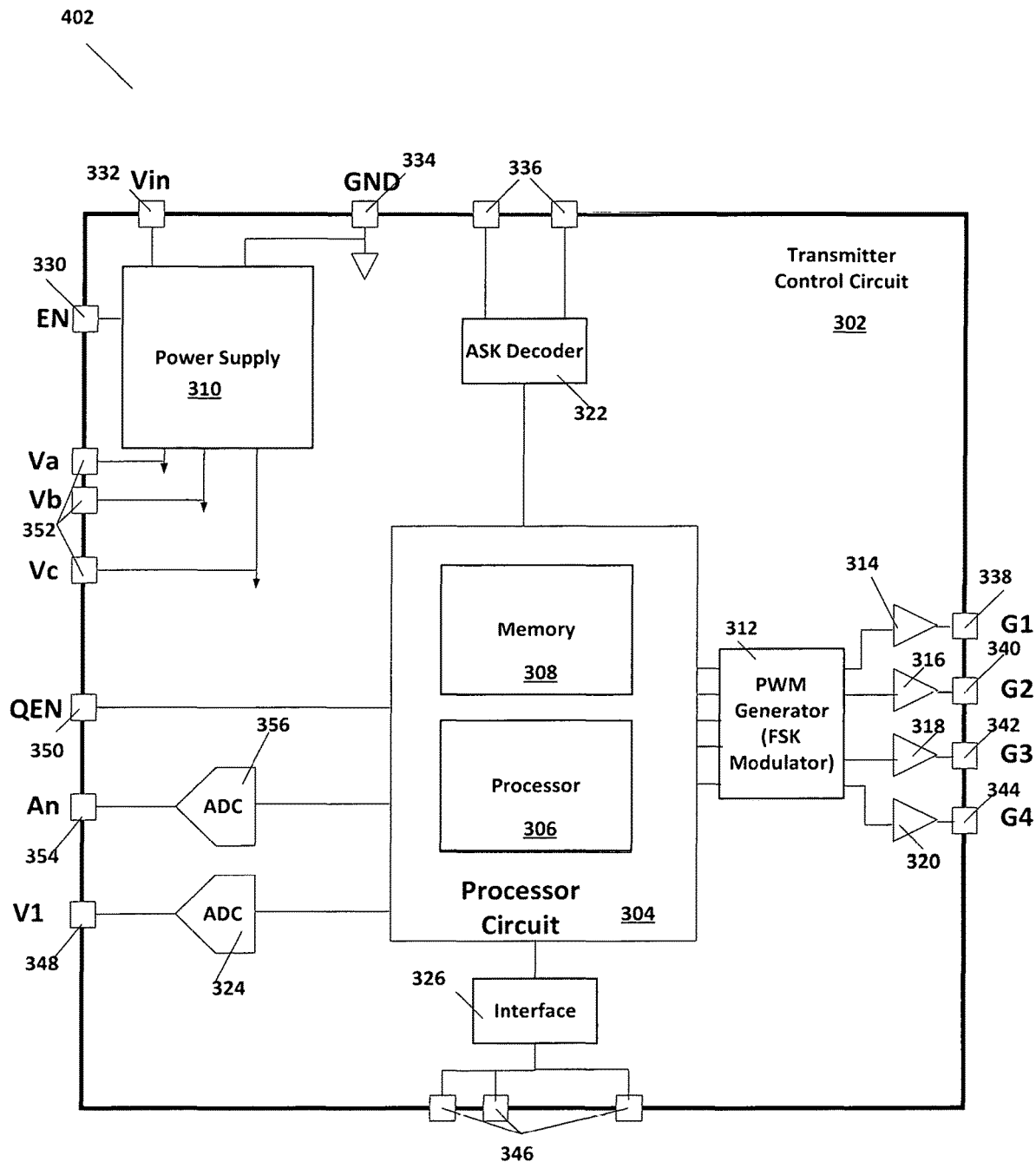
FIG. 3 illustrates a transmitter control circuit that can be used in embodiments of the present invention.

Transmitter control circuit 402 can be any transmitter control circuitry capable of performing the analysis described here. For example, the wireless power transmitter chip P9242-R is available from Integrated Device Technology, 6024 Silver Creek Valley Road, San Jose, Calif. 95138. An example simplified block diagram of transmitter control circuit 402 is illustrated in FIG. 3. Although FIG. 3 depicts a single Integrated Circuit that includes the functionality of transmitter control circuit 402, one skilled in the art will understand that the equivalent components can be included in multiple integrated circuits.

In the example illustrated in FIG. 3, transmitter control circuit 402 is formed on an integrated circuit 302. Transmitter control circuit 402 includes a processor circuit 304. Processor circuit 304 includes a processor 306 and memory 308. Processor 306 can be any microcontroller, microprocessor, or other processing device capable of performing the functions associated with controlling the wireless power transmitted by wireless power transmitter 400. In the P9242-R chip, processor 306 is a 32-bit ARM processor. Memory 308 can be a combination of volatile and non-volatile memory structures for storage of data and firmware programming instructions for processor 306. Processor 306 executes instructions stored in memory 308 to control the operation of wireless power transmitter 400. In some embodiments, processor circuit 304 can be coupled by an interface circuit 326 to interface pins 346, by which firmware held in memory 308 can be loaded or updated.

As is further illustrated in FIG. 3, processor circuit 304 is coupled to a PWM generator and FSK modulator 312. Generator 312 provides signals to gate drivers 314, 316, 318, and 320. Gate drivers 314, 316, 318, and 320 are coupled to pins 338, 340, 342, and 344, respectively, to provide driving signals to the gates of transistors Q1 204, Q2 206, Q3 208, and Q4 210, respectively. Generator 312 can also provide frequency shift keyed communications according to signals from processor circuit 304. Processor circuit 304 also can provide signals to generator 312 to determine the gate voltage levels and the center frequency.

In addition to providing communications in generator 312 by FSK modulation, transmit control circuit 402 further includes an amplitude shift-keyed (ASK) decoder 322 that provides digital data to processor circuit 304 that is encoded onto the wireless power signal by receiver 110. ASK decoder 322 receives input on pins 336 that are indicative of the amplitude modulation on the wireless power transmission signal.

In the example transmitter control circuit 402 illustrated in FIG. 3, a power supply 310 receives the input voltage Vin on pin 332, an enable (EN) on pin 330, and ground GND on pin 334. Power supply 310, which may be incorporated on IC 302, provides voltages to other circuits in IC 302. In FIG. 3, power supply 310 is shown provided three voltages Va, Vb, and Vc. Further, these voltages may be provided to pins 352. In some embodiments, Va, Vb, and Vc may be, for example, 5V, 3.3V, and 1.8V. Other voltages may be provided as well.

Processor circuit 304 is further coupled to pin 350 to provide the QEN enable signal. Additionally, transmitter control circuit 402 includes a pin 348 to receive an analog signal. One or more analog-to-digital converters (ADC) (ADCs 324 and 356) digitizes analog signals received on analog input pins (pins 348 and 354 are illustrates) to provide digital data to processor circuit 304.

As shown in FIG. 4A, and discussed above, a bridge circuit formed by transistors Q1 204, Q2 206, Q3 208, and Q4 210 is coupled across the resonant circuit formed by transmission coil Lp 116 and capacitor Cp 114. As before, transistors Q1 204 and Q3 208 are coupled in series between voltage rail 226, which is coupled directly to the input voltage Vin, and ground. Similarly, transistor Q2 206 and Q4 210 are coupled in series between voltage rail 226 (Vin) and ground. The resonant circuit formed by series coupled transmit coil 106 and capacitor 114 are coupled between a node joining transistors Q1 204 and Q3 208 and a node joining transistors Q2 206 and Q4 210. As discussed above, the input voltage Vin can be a high voltage (e.g. about 9 V). A low voltage Va (e.g. 1.8 V) can be output from transmitter control circuit 402 to series coupled transistors Q5 406 and Q6 408. A capacitor C2 410 can be coupled between the voltage Va and ground. A resistor 414 can be coupled between transistors Q5 408 and Q6 408 and a node between transmit coil 106 and capacitor 114. Additionally, the node between transmit coil 106 and capacitor 114 can be coupled through a diode D1 404 to an Envelope and Frequency Detection Circuit 412. In some embodiments, detection circuit 412 can provide analog voltage and frequency data to the analog inputs (pins 348 and 354) of transmitter control circuit 402. In some embodiments, detection circuit provides voltage data to control circuit 402, from which control circuit 402 can determine frequency.

FIG. 4C illustrates a process 430 that can be executed on processor circuit 304 according to the present invention. Process 430 controls the operation of wireless power transmitter 400 in order to determine parameters such as the Q-factor. As illustrated in FIG. 4B, process 430 starts in step 432. As discussed above, step 432 can be started, for example, when a receiver 110 is first indicated and the wireless power transmission is initiated. In step 434, transmit control circuit prepares wireless power transmitter 400 by turning transistors Q1 204, Q2 206, and Q3 208 off and turning transistor Q4 210 on, grounding one side of capacitor 114.

In step 436, capacitor 114 is charged to the voltage Va by turning transistors Q5 406 and Q6 408 on with the enable signal QEN. Charging can continue for a set period of time. Alternatively, the voltage across capacitor 114 (Vcp) can be monitored through detection circuit 412 so that transmit control circuit 402 can continue charging until the voltage Vcp reaches a certain threshold value. The starting voltage across capacitor 114 is $V_0$ (i.e. Vcp(0)=$V_0$).

Once capacitor Cp 114 is charged to the starting voltage $V_0$, process 430 proceeds to step 440 where the resonant circuit formed by transmit coil Lp 106 and capacitor Cp 114 starts to freely oscillate. This is accomplished by setting transistors Q5 406 an Q6 408 off and setting Q3 208 on in order to stop charging and ground both sides of the resonant circuit, creating a free-oscillating circuit. The resulting oscillating waveform 422 is illustrated in FIG. 4C. In step 442, the oscillation data is recorded for further analysis. This is accomplished by receiving the data from detection circuit 412 and sampling the data in transmitter control circuit 402 at an appropriate rate to provide good data analysis. The parameters are describing the characteristics of the resonant circuit formed by transmit coil Lp 106 and capacitor Cp 114 is then determined in step 444.

As is illustrated in FIG. 4C, the voltage across capacitor Cp 114 ($V_{cp}(t)$) while the resonant circuit formed by transmit coil Lp 106 and capacitor Cp 114 is freely oscillating is shown as waveform 422, which is a damped oscillating circuit. Generally, this system can be modeled as a linear homogeneous differential equation of order. This system has the general solution $$V_{cp}(t) = V_0 e^{-\frac{\omega}{2Q}t} \cos\left(\omega t \sqrt{1 - \frac{1}{4Q^2}} + \varphi\right),$$

where $V_0$ and $\varphi$ are constants during the free-oscillation, $\omega$ is the resonant frequency $2\pi f_0$, Q is the quality factor of the resonant circuit, and t is time. In most cases, Q is large enough that the value of $V_{cp}(t)$ becomes $$V_{cp}(t) = V_0 e^{-\frac{\omega}{2Q}t} \cos(\omega t + \varphi).$$

Consequently, the resonant frequency $f_0$ can be determined directly from the time between successive oscillations of the exponentially decaying cosine function of waveform 422.

As is further illustrated in FIG. 4C, the amplitude envelope 420, $V_{env}(t)$, is an exponential decay which, as discussed above, is given by $$V_{env}(t) = V_0 e^{-\frac{\omega}{2Q}t}.$$

Consequently, since the resonant frequency $f_0$ is known, and therefore the frequency $\omega$ is known, the Q-factor Q can be determined from the exponential decay curve (or envelope curve) 420. In particular, one method of determining Q is to pick a time T, determine the value of the envelope at time T, $V_{env}(T)$, and determine the value of Q, which from the above equation for $V_{env}(t)$ is given by $$Q = \frac{\pi f_0 T}{\ln\left(\frac{V_0}{V_{env}(T)}\right)}.$$

In some embodiments, a simpler calculation can be performed in step 444. If, instead of using a time T, the number of oscillations required such that $V_{env}$ is approximately $V_0/2$, then T=N/$f_0$ and the above equation for Q becomes $$Q \cong \frac{\pi N}{\ln(2)} \cong 4.532 N.$$

Consequently, Q can be calculated by counting the number of oscillations of Vcp(t) until the peak value of Vcp(t) becomes $V_0/2$ and then multiplying that number by 4.532. Although losing some accuracy with this method, the resulting process can be very quick.

As discussed above, wireless power transmitter 400 as illustrated FIG. 4A can facilitate a method of determining the Q-factor Q as well as the resonant frequency $f_0$. In some embodiments, for example, the charging voltage Va from transmit control circuit 402 can be a 1.8V output from transmitter control circuit 402. Transistors Q5 406, Q6 408 and Resistor R1 414 then form a circuit to charge Cp to about 1.8V at the initiation of a Q-factor detection process 430 as illustrated in FIG. 4B.

Transmit coil Lp 106, capacitor Cp 114, transistor Q3 208, and transistor Q4 210 form a free running resonant circuit during Q-factor detection. Frequency Detection, on top of the Envelope Detection, is added to detect the resonant frequency as well as the amplitude to the voltage across the resonant capacitor Cp 114.

During Q-Factor detection, transistors Q3 208 and Q4 210 are on and transistors Q1 204, Q2 206, Q5 406 and Q6 408 are off. Under those conditions, as illustrated in FIG. 4C, the tank circuit formed by transmit coil Lp 106 and capacitor Cp 114 oscillates at its resonant frequency $f_0$ and decays at a rate that is dependent on the Q-factor Q. The decay in the magnitude of the voltage across capacitor Cp 114, which can be measured by measuring the voltage difference from the maximum voltage, V, at a given time T, can be used to calculate the Q-factor Q.

At the start of the determination process, the voltage across capacitor Cp 114 should be low enough that the power transmitter from transmission coil 106 is insufficient to activate a closely situation receiver 110. As discussed above, the 1.8V output or another pre-determined low voltage is such that they will not turn on a rectification circuit of a wireless receiver, Rx, that may be near the transmitter. The input voltage Vin should be greater or equal to 1.8V or the pre-determined voltage.

Once the pre-charge process finishes in step 438 (where the starting voltage $V_0$ is determined), then transistors Q5 406 and Q6 408 are turned off. In some embodiments, before the Q-factor detection process starts, the voltage across capacitor Cp 114 is sampled as reference starting voltage $V_0$. Then Q-factor detection process starts by turning on transistor Q3 208. During Q-factor detection process, both resonant frequency, fo, and the envelop of Vcp(t) are sampled periodically until all necessary data are collected. Then the Q-factor is calculated based on data T and Vcp(t) from a pre-determined algorithm that analyses the waveform as illustrated in FIG. 4C and as discussed above.

Process 430 as illustrated in FIG. 4B has a number of advantages over the conventional method illustrated in FIGS. 2A and 2B. First, the voltages across the resonant components, capacitor Cp 114 and transmit coil Lp 106, are sinewave signals and the maximum value is fixed. This guarantees not to turn on a receiver Rx 110 while a Q-factor detection is underway. Further, the resonant circuit always oscillates at the resonant frequency. There is therefore no need to do any frequency sweeping and no need to generate an ac voltage source to drive the resonant circuit. The resonant frequency can be determined directly from the sinusoidal curve 422, as described above.

Additionally, transmit control circuit 202 always samples the voltage across capacitor Cp 114, which eliminates any sampling error due to DC voltage and AC voltage sampling. Further, the resonant capacitor voltage amplitude decay, envelope 420, provides the information to calculate the Q-factor Q in a much simpler calculation.

Consequently, a wireless power transmitter circuit that allows measurement of the Q-factor according to some embodiments includes a pre-charge circuit that charges the resonant capacitor 114 to a pre-determined voltage, a detection circuit that samples the voltage across resonant capacitor 114, and a control circuit that analysis the sampled data to determine both the resonant frequency $f_0$ and the Q-factor Q. The control circuit 402 works with tank circuit capacitor Cp 114 and transmit coil Lp 104 to form a free running resonant circuit. In some embodiments, detection circuit 412 can determine the resonant frequency and other parameters of the resonant circuit. Further, an algorithm executable in control circuit 402 can calculate the Q-factor Q based on the parameters and data provided from detection circuit 412.

The pre-charge circuit (formed by transistors Q5 406, Q6 408, and resistor 414) pre-charges the resonant capacitor 114 to a pre-determined voltage. Then, the resonant circuit, consisting of capacitor Cp 114 and transmit coil Lp 106, is configured to be a free running resonant circuit. Finally, detection circuit 412 detects the resonant frequency and capacitor voltage (Vcp(t)) decay rate of the free running resonant circuit. An algorithm that can calculate the Q-factor Q based on these parameters is executed in control circuit 402.

Once the Q-factor of the resonant circuit formed by transmission coil 106 and capacitor 114 is calculated, a determination whether or not there is a foreign object proximate the transmit coil can be made. In particular, in step 446 of process 430, the Q-factor can be compared with a threshold value. If the Q-factor is less than the threshold value, then control circuit 402 can indicate presence of a foreign object. If the Q-factor is greater than the threshold value, then control circuit 402 can return to normal operation.

The above detailed description is provided to illustrate specific embodiments of the present invention and is not intended to be limiting. Numerous variations and modifications within the scope of the present invention are possible. The present invention is set forth in the following claims.

What is claimed is:

1. A wireless power transmitter, comprising:
a transmit coil, the transmit coil configured to transmit wireless power;
a capacitor coupled in series with the transmit coil to form a resonant circuit between a first node at the transmit coil and a second node at the capacitor, the transmitter coil and the capacitor being coupled at a third node;
a bridge circuit coupled to the first node and the second node of the resonant circuit;
a charging circuit coupled to the third node and configured to charge the capacitor with a charging voltage; and
a detection circuit coupled to the third node to receive a voltage across the capacitor and provide data related to the voltage;
a control circuit coupled to the bridge circuit, the charging circuit, and the detecting circuit,
wherein the control circuit controls the bridge circuit to provide current through the transmit coil to provide wireless power, and further
wherein the control circuit determines a Q-factor by controlling the bridge circuit to ground the second node and disconnect the first node, controlling the charging circuit to charge the capacitor when the second node is grounded, when the capacitor is charged controlling the bridge circuit to further ground the first node, and receiving the data from the detecting circuit while the resonant circuit oscillates to determine the Q-factor.

2. The transmitter of claim 1, wherein the control circuit includes a processor that executes instructions to:
control the bridge circuit and the charging circuit to ground the second node and charge the capacitor;
once the capacitor is charged, set the transmit coil and the series capacitor into a free oscillation by grounding the first node;
receive the data from the detection circuit; and
determine a Q-factor from the data.

3. The transmitter of claim 2, wherein the charging circuit includes:
a resistor coupled to the third node between the transmit coil and the capacitor; and
a charging transistor coupled in series between a voltage output to provide a charging current and the charging voltage to the capacitor.

4. The transmitter of claim 3, wherein the charging voltage does not activate a receiver placed proximate to the transmission coil.

5. The transmitter of claim 3, wherein the bridge circuit comprises:
a first transistor coupled between a voltage rail and the first node;

a second transistor coupled between the voltage rail and the second node;

a third transistor coupled between the first node and ground; and a fourth transistor coupled between the second node and ground.

6. The transmitter of claim 5, wherein the instructions to charge the capacitor include instructions to disconnect the first node by turning the first transistor and the third transistor to off;

ground the second node by turning the second transistor off and turning the fourth transistor to on; and charge the capacitor by turning the charging transistor to on.

7. The transmitter of claim 6, wherein instructions to set the transmit coil and the series capacitor into free oscillation includes instructions to stopping charging by turning the charging transistor to off;

measure an initial voltage across the capacitor at the third node, the initial voltage determined from the data; and ground the first node by turning the third transistor on.

8. The transmitter of claim 2, wherein the data represents a decaying sinusoidal of the free oscillation and wherein the control circuit executes instructions to determine a decay of an envelope of the data;

receive a resonant frequency from the detection circuit;

determine a voltage of the envelope at a time T; and determine the Q factor from the voltage of the envelope.

9. The transmitter of claim 2, wherein the data represents a decaying sinusoidal of the free oscillation and wherein the control circuit executes instructions to count a number of oscillations until a peak envelope voltage reaches ½ of an initial voltage;

determine the Q-factor from the number.

10. A method of measuring a Q-factor in a wireless power transmitter, comprising:

discontinuing transmission of wireless power, the wireless power being transmitted with a transmission coil coupled in series with a capacitor between a first node and a second node and driven by a bridge circuit coupled to the first node and the second node, the transmission coil and the capacitor forming an LC tank circuit;

operating the bridge circuit to ground the second node and disconnect the first node;

charging the capacitor in the LC tank circuit to a charged voltage by applying a charging voltage to a third node between the transmission coil and the capacitor;

when the capacitor is charged to the charged voltage, further operating the bridge circuit to ground the first node to form a free-oscillating circuit;

monitoring the voltage across the capacitor as a function of time as the LC tank circuit oscillates; and determining the resonant frequency and a Q-factor from monitoring the voltage.

11. The method of claim 10, wherein charging the capacitor in the LC tank circuit includes applying a voltage through a resistance to a third node where the transmit coil and the capacitor is coupled; and removing the voltage when the capacitor is charged to the charged voltage.

12. The method of claim 11, wherein the voltage does not activate a receiver proximate to the transmit coil.

13. The method of claim 11, wherein monitoring the voltage includes measuring the capacitor voltage at the third node as a function of time, the capacitor voltage being a decaying sinusoidal signal.

14. The method of claim 13, wherein determining the resonant frequency and the Q-factor includes determining the resonant frequency from the sinusoidal portion of the decaying sinusoidal signal; and determining the Q-factor from the decaying portion of the decaying sinusoidal signal.

15. The method of claim 10, further including comparing the Q-factor with a threshold value; and indicating the presence of a foreign object if the Q-factor is less than the threshold value.

16. A wireless power transmitter, comprising:

means for charging a capacitor in a resonant circuit that includes the capacitor series coupled with a transmit coil between a first node and a second node, the means for charging the capacitor coupled to a third node between the capacitor and the transmit coil;

means coupled to the first node and the second node for driving the resonant circuit to transmit wireless power and to ground the first node and the second node during a Q-factor determination, means for sampling a voltage across the capacitor at the third node as a function of time;

means for controlling coupled to the means for charging the capacitor, the means coupled to the first node and the second node, and the means for sampling, wherein the means for controlling provides wireless power by controlling the means coupled to the first node and the second node to drive current through the transmit coil, and wherein the means for controlling determines a Q-factor by controlling the means coupled to the first node and the second node to ground the second node and disconnect the first node, then controlling the means for charging to charge the capacitor, then, when the capacitor is charged, controlling the means coupled to the first node and the second node to ground the first node and receiving operating the and wherein the means for sampling the voltage samples data while the first node and the second node are grounded to provide data to determine the Q-factor;

wherein the means for controlling includes a means for determining a resonant frequency of the resonant circuit from the voltage sampled by the means for sampling; and wherein the means for controlling includes means for determining a Q-factor from the voltage sampled by the means for sampling.

17. The wireless power transmitter of claim 16, further including means for determining presence of a foreign object from the Q-factor.

* * * * *